(12) United States Patent
Kim

(10) Patent No.: US 6,398,974 B1
(45) Date of Patent: *Jun. 4, 2002

(54) METHOD OF FORMING AN ELECTRODE FOR A THIN FILM TRANSISTOR

(75) Inventor: Myung Joon Kim, Daeku (KR)

(73) Assignee: LG. Philipslcd Co., Ltd., Seoul (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/465,401

(22) Filed: Dec. 17, 1999

(30) Foreign Application Priority Data

Dec. 17, 1998 (KR) .............................. 98-55646

(51) Int. Cl.$^7$ .............................. C23F 1/00; H05H 1/00
(52) U.S. Cl. ........................ 216/13; 216/100; 216/103; 216/108; 156/345.11
(58) Field of Search ................. 216/103, 108, 216/13, 100, 41, 19, 22; 156/345.11; 438/585

(56) References Cited

U.S. PATENT DOCUMENTS

| | | | | |
|---|---|---|---|---|
| 3,833,434 A | * | 9/1974 | Kikushi et al. ............... 216/19 |
| 4,283,248 A | * | 8/1981 | Kakuhashi et al. ........... 216/90 |
| 5,059,278 A | * | 10/1991 | Cohen et al. .................. 216/22 |
| 5,464,500 A | * | 11/1995 | Tsujimura et al. ............ 216/34 |
| 5,639,344 A | * | 6/1997 | Konuma et al. ............ 438/585 |

* cited by examiner

*Primary Examiner*—Gregory Mills
*Assistant Examiner*—P. Hassanzadeh
(74) *Attorney, Agent, or Firm*—Long Aldridge & Norman, LLP

(57) ABSTRACT

The present invention relates to a method of forming an electrode for a thin film transistor, which forms an electrode of a double-layered structure consisting of first and second metal layers by carrying out two steps of etching the metal layers by means of varying the diluted density of an etching solution, preventing hillock and junction spiking as well as controlling the generation of undercutting. The method includes the steps of forming a first and second metal layer on a substrate successively, forming a photoresist pattern on a predetermined portion of the second metal layer, etching the second metal layer to expose the first metal layer with a dense mixed solution of ($H_3PO_4O+HNO_3+CH_3COOH+H_2O$), using the photoresist pattern as an etch mask, etching the exposed first metal layer with a diluted mixed solution of ($H_3PO_4O+HNO_3+CH_3COOH+H_2O$), using the photoresist pattern as an etch mask, and removing the photoresist pattern.

15 Claims, 3 Drawing Sheets

(mixed solution:deionised water=1:X)

METHOD OF FORMING AN ELECTRODE FOR A THIN FILM TRANSISTOR

This application claims the benefit of Korean Patent Application No. 1998-55646, filed on Dec. 17, 1998, which is hereby incorporated by reference for all purposes as if fully set forth herein.

BACKGROUND OF THE INVENTION

1. Field of the Invention

The present invention relates to a method of forming an electrode for a thin film transistor, and more particularly to forming an electrode having a double-layered structure, consisting of first and second metal layers, by etching the metal layers in two steps varying the diluted density of an etching solution.

2. Discussion of the Related Art

In a liquid crystal display (hereinafter abbreviated LCD), thin film transistors (hereinafter abbreviated TFT) used as switching devices of driving devices and pixel electrodes transmitting or reflecting light are arranged in a matrix structure. Each of the TFTs and pixel electrodes constitutes a basic unit.

As the size of an LCD becomes larger, image distortion is caused by the delay of gate and data signals. In order to prevent the delays of the gate and data signals, the gate, source, and drain electrodes should be made of a metal having a low resistance, such as Al and the like.

Yet, hillock and junction spiking are generated if the gate, source, and drain electrodes are formed with Al. Therefore, the electrodes are constructed with two layers such that a refractory metal lies on an Al layer, specifically the refractory metal Mo or an alloy of Mo, such as MoW, MoTa, MoNb, and the like.

FIGS. 1A to 1C show a method of forming an electrode of a TFT according to a related art.

Referring to FIG. 1A, first and second metal layers 13 and 15 respectively are formed on a substrate 11. The first metal layer 13 is made of a metal having a low resistance, such as Al and the like, and the second layer 15 is made of Mo or an alloy of and Mo, such as MoW, MoTa, MoNb, and the like. The metal layers 13 and 15 are deposited successively by chemical vapor deposition (hereinafter abbreviated CVD) or by sputtering.

In this case, the substrate 11 is an insulated substrate made of an insulated material such as glass, quartz, transparent plastic, or the like. Also, the substrate 11 may include an insulating layer of silicon oxide, silicon nitride, or the like formed on the insulated substrate.

A photoresist pattern 17 is formed by coating the second metal layer 15 with photoresist, then by patterning the photoresist to remain on only a predetermined portion of the second metal layer 15 by exposure and development.

Referring to FIG. 1B, an electrode 19 is formed by etching the second and first metal layers 15 and 13 using the photoresist pattern 17 as an etch mask to expose the substrate 11. In this case, the electrode 19 is formed by etching the second and first metal layers 15 and 13 with an etching solution mixed with ($H_3PO_4O + HNO_3 + CH_3COOH + H_2O$), or another solution of ($H_3PO_4O + HNO_3 + CH_3COOH + H_2O$) mixed with deionized water, which is diluted by a mixing ratio equal to or less than 1:2.

Referring to FIG. 1C, the photoresist pattern 17 on the electrode 19 is removed by ashing. Thus, the electrode 19 remaining on the substrate 11 becomes a gate, source, or drain electrode.

In accordance with the related art, the electrode is formed by etching the second and first metal layers with an etchant of an etching solution mixed with ($H_3PO_4O + HNO_3 + CH_3COOH + H_2O$) only, or another solution of ($H_3PO_4O + HNO_3 + CH_3COOH + H_2O$) mixed with deionized water, which are diluted by a mixing ratio equal to or less than 1:2.

Unfortunately, the method of forming an electrode of the related art may cause hillock and junction spiking as the exposed surface of the second metal layer is broadened by using the etching solution mixed with ($H_3PO_4O + HNO_3 + CH_3COOH + H_2O$) only, or another solution of ($H_3PO_4O + HNO_3 + CH_3COOH + H_2O$) mixed with deionized water, which is diluted by a mixing ratio less than 1:2. This is because the etch rate of the second metal layer is 4 to 5 times faster than that of the first metal layer.

Moreover, when the quantity of the mixed solution of ($H_3PO_4O + HNO_3 + CH_3COOH + H_2O$) exceeds that of deionized water, undercutting is generated since the etch rate of the first metal layer is faster than that of the second metal layer.

SUMMARY OF THE INVENTION

Accordingly, the present invention is directed to a method for forming an electrode for a thin film transistor that substantially obviates one or more of the problems due to limitations and disadvantages of the related art.

An object of the present invention is to provide a method of fabricating en electrode which prevents hillock and junction spiking and also controls undercutting.

Additional features and advantages of the invention will be set forth in the description which follows, and in part will be apparent from the description, or may be learned by practice of the invention. The objectives and other advantages of the invention will be realized and attained by the structure particularly pointed out in the written description and claims, as well as the appended drawings.

To achieve these and other advantages and in accordance with the purpose of the present invention, as embodied and broadly described, a method according to the present invention includes: forming first and second metal layers successively on a substrate; forming a photoresist pattern on a predetermined portion of the second metal layer; etching the second metal layer to expose the first metal layer with a dense mixed solution of ($H_3PO_4O + HNO_3 + CH_3COOH + H_2O$), using the photoresist pattern as an etch mask; etching the exposed first metal layer with a diluted mixed solution of ($H_3PO_4O + HNO_3 + CH_3COOH + H_2O$), using the photoresist pattern as an etch mask; and removing the photoresist pattern.

It is to be understood that both the foregoing general description and the following detailed description are exemplary and explanatory and are intended to provide further explanation of the invention as claimed.

BRIEF DESCRIPTION OF THE DRAWING

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiment of the present invention, an example of which is illustrated in the accompanying drawings.

FIGS. 2A to 2D show a preferred embodiment of a method of forming an electrode of a TFT according to the present invention.

Figure 1A:
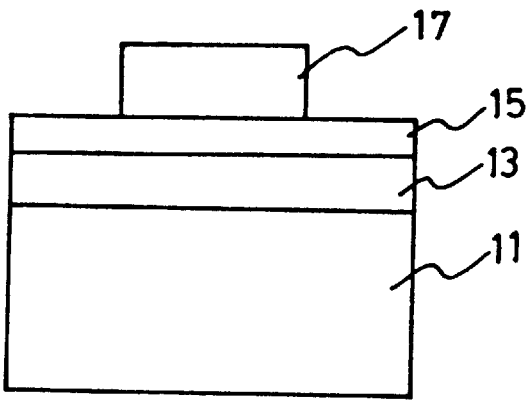
FIGS. 1A to 1C show a method of forming an electrode of a TFT according to a related art.
Figure 1B:
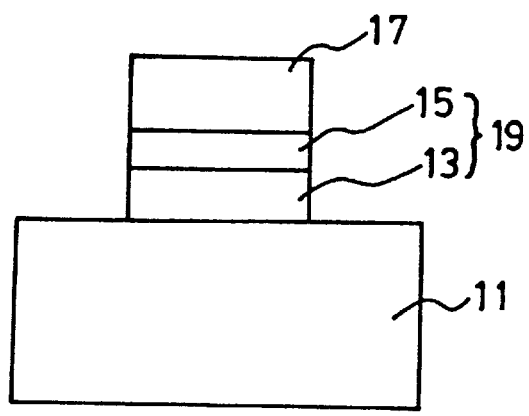
Figure 1C:
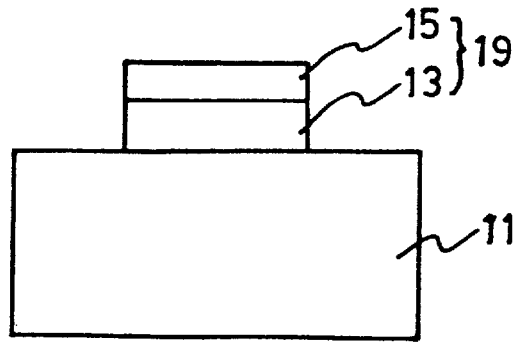
Figure 2A:
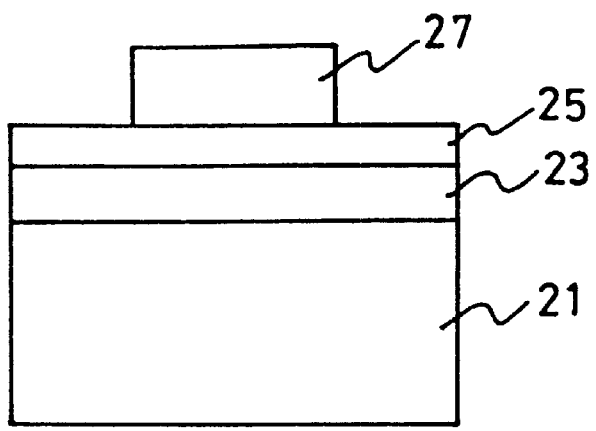
FIGS. 2A to 2D show a preferred embodiment of a method of forming an electrode of a TFT according to the present invention.
Figure 2B:
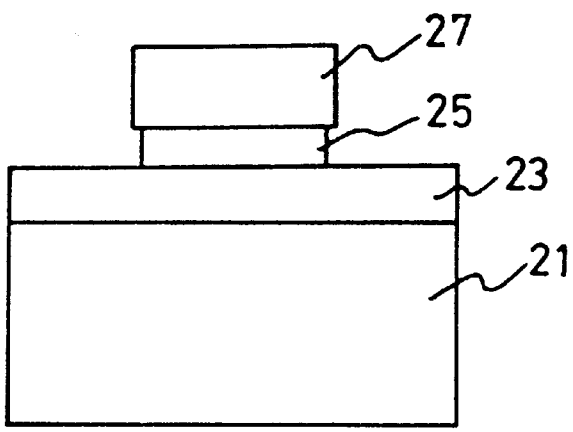

Referring to FIG. 2A, first and second metal layers 23 and 25 respectively are formed on a substrate 21. The first metal layer 23 is made of metal having a low resistance, such as Al and the like, and the second metal layer 25 is made of Mo or an alloy of Mo, such as MoW, MoTa, MoNb, and the like. The metal layers 23 and 25 are deposited successively by chemical vapor deposition (hereinafter abbreviated CVD), or by sputtering.

In this case, the substrate 21 is an insulated substrate made of an insulating material such as glass, quartz, transparent plastic, or the like. Also, the substrate 11 may include an insulating layer of silicon oxide, silicon nitride, or the like formed on the insulated substrate.

A photoresist pattern 27 is formed by coating the second metal layer 25 with photoresist, then by patterning the photoresist to remain only on a predetermined portion of the second metal layer 25, by exposure and development.

Referring to FIG. 23, the second metal layer 25 is etched to expose the first metal layer 23, using the photoresist pattern 27 as an etch mask. In this case, the second metal layer 25 is etched by an etching solution mixed with ($H_3PO_4O+HNO_3+CH_3COOH+H_2O$), or another solution of ($H_3PO_4O+HNO_3+CH_3COOH+H_2O$) mixed with deionized water, which is diluted by a mixing ratio equal to or less than 1:2. The second metal layer 25 is selectively etched because the etch rate of the second metal layer 25 is 4 to 5 times faster than that of the first metal layer 23 using a solution of this mixing ratio.

Figure 2C:
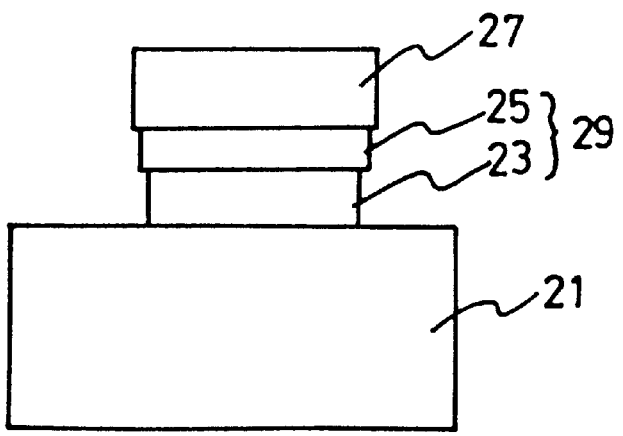

Referring to FIG. 2C, the first metal layer 23 is etched to expose the substrate using the photoresist pattern 27 as an etch mask. In this case, the first metal layer 23 is etched by an etching solution of ($H_3PO_4O+HNO_3+CH_3COOH+H_2O$) mixed with deionized water which is diluted by a mixing ratio equal to or higher than 1:3.

In this case, the mixed solution of ($H_3PO_4O+HNO_3+CH_3COOH+H_2O$), which is diluted to low density, does not etch the second metal layer 25 but etches the first metal layer 23. Thus, the width of the first metal layer 23 becomes equal to or less than that of the second metal layer 25, because of undercutting.

Therefore, the second metal layer 25 prevents hillock and junction spiking due to the first metal layer 23, and also controls undercutting. The remaining first and second metal layers 23 and 25 become an electrode 29.

Figure 2D:
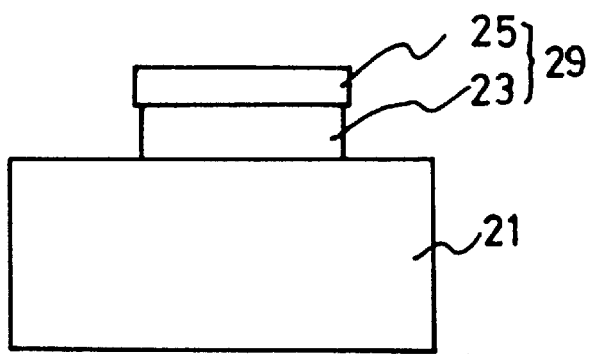

Referring to FIG. 2D, the photoresist pattern 27 on the electrode 29 is removed by ashing. Thus, the electrode 29 remaining on the substrate 21 only may become a gate, source, or drain electrode.

Figure 3:
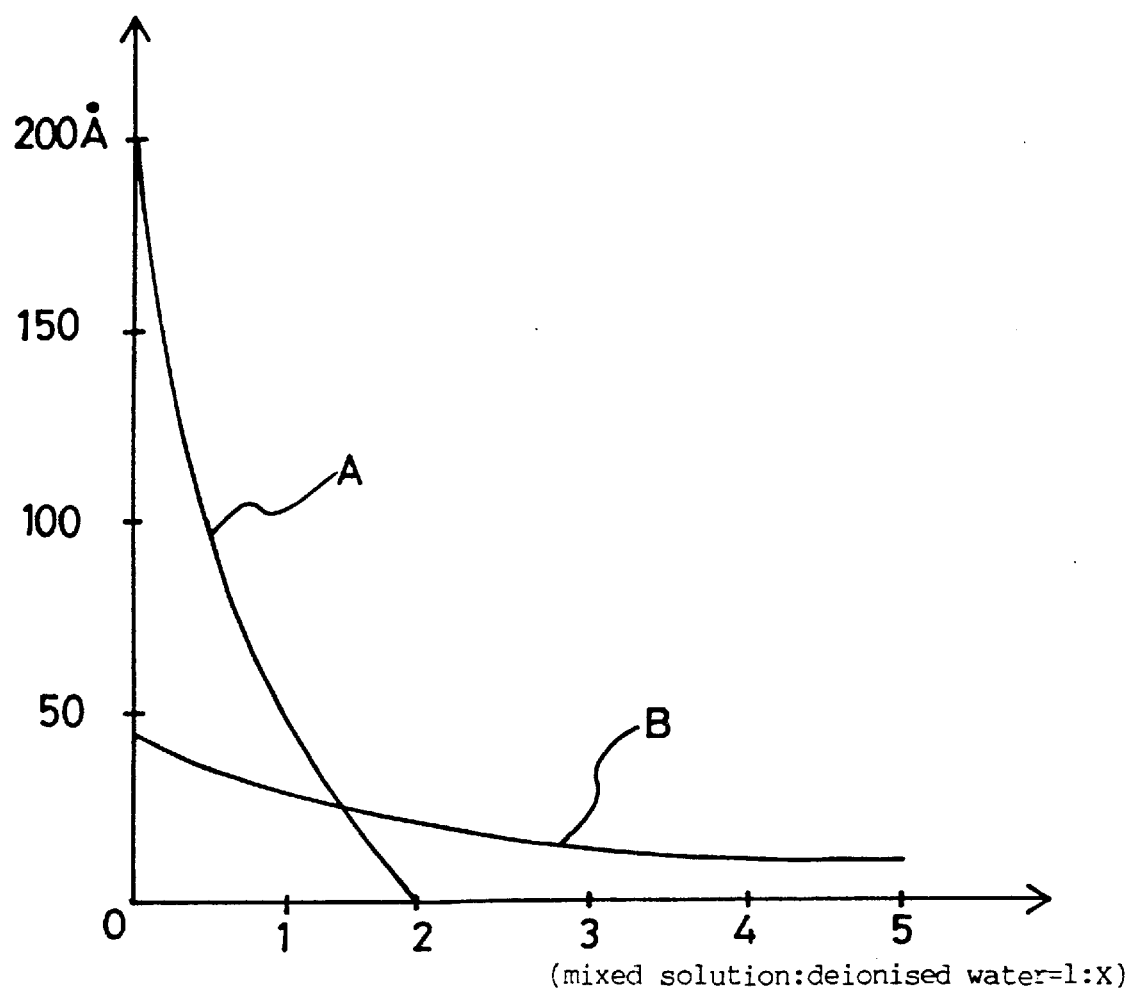
FIG. 3 shows a graph comparing the etch rates of Mo and Al in accordance with the diluted density of an etching solution.

FIG. 3 shows a graph comparing etch rates of Mo for the second metal layer and Al for the first metal layer in accordance with diluted density of an etching solution.

Referring to FIG. 3, the x-axis indicates a mixing ratio of a mixed solution ($H_3PO_4O+HNO_3+CH_3COOH+H_2O$) and deionized water, the y-axis indicates the etch rate, curve A shows the etch rate of Mo vs. mixing ratio, and curve B shows an etch rate of Al vs. mixing ratio.

When the mixed solution of ($H_3PO_4O+HNO_3+CH_3COOH+H_2O$) only is used, the etch rate of the first metal layer 23 is about 45 Å/sec while that of the second metal layer 25 is about 200 Å/sec. Thus, the latter is faster 4 to 5 times than the former.

When the mixed solution of ($H_3PO_4O+HNO_3+CH_3COOH+H_2O$), or the mixed solution of ($H_3PO_4O+HNO_3+CH_3COOH+H_2O$) diluted by deionized water, with the ratio 1:1.5 only is used, the etch rate of the second metal layer 25 is faster than that of the first metal layer 23. Therefore, the second metal layer 25 is etched by the mixed solution of ($H_3PO_4O+HNO_3+CH_3COOH+H_2O$), or another mixed solution of ($H_3PO_4O+HNO_3+CH_3COOH+H_2O$) diluted by deionized water, with the ratio under 1:2.

Moreover, when the ratio between the mixed solution of ($H_3PO_4O+HNO_3+CH_3COOH+H_2O$) and deionized water is over 1:2.5, the second metal layer 25 is not etched but the first metal layer 23 is etched slowly. Therefore, the first metal layer 23 is etched by the mixed solution of ($H_3PO_4O+HNO_3+CH_3COOH+H_2O$) diluted by deionized water with a mixing ratio of over 1:2.5.

In this case, the etch rate of the first metal layer 23 is lowered when deionized water exceeds the mixed solution of ($H_3PO_4O+HNO_3+CH_3COOH+H_2O$). Thus, it is desirable to dilute the mixed solution of ($H_3PO_4O+HNO_3+CH_3COOH+H_2O$) with deionized water to a ratio ranging 1:2.5 to 1:20.

As mentioned in the above description, the electrode is formed by etching the second metal layer with the mixed dense solution of ($H_3PO_4O+HNO_3+CH_3COOH+H_2O$) only, or another dense mixed solution of ($H_3PO_4O+HNO_3+CH_3COOH+H_2O$) diluted by deionized water with a ratio under 1:2, then by etching the first metal layer with the weak mixed solution of ($H_3PO_4O+HNO_3+CH_3COOH+H_2O$) diluted by deionized water with a mixing ratio greater than 1:3.

Accordingly, the present invention prevents hillock and junction spiking and also controls undercutting by forming the second metal layer to cover the first metal layer.

It will be apparent to those skilled in the art that various modifications and variations can be made in the method of the present invention without departing from the spirit or scope of the invention. Thus, it is intended that the present invention cover the modifications and variations of this invention provided they come within the scope of the appended claims and their equivalents.

What is claimed is:

1. A method of forming an electrode, comprising:

forming an aluminum layer on a substrate and a molybdenum layer on the aluminum layer;

forming a photoresist pattern on a predetermined portion of the molybdenum layer;

etching the molybdenum layer to expose the aluminum layer using a first mixed solution of ($H_3PO_4+HNO_3+CH_3COOH+H_2O$) and the photoresist pattern as an etch mask;

etching the exposed aluminum layer with a second mixed solution of ($H_3PO_4+HNO_3+CH_3COOH+H_2O$) and the photoresist pattern as an etch mask; and removing the photoresist pattern;

wherein a concentration of the second mixed solution of ($H_3PO_4+HNO_3+CH_3COOH+H_2O$) used to etch the aluminum layer differs from a concentration of the first mixed solution of ($H_3PO_4$+$HNO_3$+$CH_3COOH$+$H_2O$) used to etch the molybdenum layer.

2. The method of forming an electrode according to claim 1, wherein the molybdenum layer is etched by the first mixed solution of ($H_3PO_4$+$HNO_3$+$CH_3COOH$+$H_2O$) only.

3. The method of forming an electrode according to claim 1, wherein the first mixed solution is selected from a group consisting of an undiluted mixed solution of ($H_3PO_4$+$HNO_3$+$CH_3COOH$+$H_2O$) and a mixed solution of ($H_3PO_4$+$HNO_3$+$CH_3COOH$+$H_2O$) diluted with deionized water having a mixed ratio less than 1:2.

4. The method of forming an electrode according to claim 3, wherein the aluminum layer is etched by a mixed solution of ($H_3PO_4$+$HNO_3$+$CH_3COOH$+$H_2O$) diluted by deionized water with a mixed ratio greater than 1:3.

5. The method of forming an electrode according to claim 1, wherein the first mixed solution is selected from a group consisting of an undiluted mixed solution of ($H_3PO_4$+$HNO_3$+$CH_3COOH$+$H_2O$) and a mixed solution of ($H_3PO_4$+$HNO_3$+$CH_3COOH$+$H_2O$) diluted with deionized water having a mixed ratio less than 1:1.5.

6. The method of forming an electrode according to claim 5, wherein the aluminum layer is etched by a mixed solution of ($H_3PO_4$+$HNO_3$+$CH_3COOH$+$H_2O$) diluted by deionized water with a mixed ratio greater than 1:3.

7. The method of forming an electrode according to claim 1, wherein the aluminum layer is etched by a mixed solution of ($H_3PO_4$+$HNO_3$+$CH_3COOH$+$H_2O$) diluted by deionized water with a mixed ratio greater than 1:3.

8. The method of forming an electrode of claim 1, wherein the concentration of the second mixed solution of ($H_3PO_4$+$HNO_3$+$CH_3COOH$+$H_2O$) used to etch the aluminum layer is less than the concentration of the first mixed solution of ($H_3PO_4$+$HNO_3$+$CH_3COOH$+$H_2O$) used to etch the molybdenum layer.

9. The method of forming an electrode of claim 1, wherein the first mixed solution of ($H_3PO_4$+$HNO_3$+$CH_3COOH$+$H_2O$) etches the molybdenum layer at a faster rate than it etches the aluminum layer, and wherein the second mixed solution of ($H_3PO_4$+$HNO_3$+$CH_3COOH$+$H_2O$) etches the aluminum layer at a faster rate than it etches the molybdenum layer.

10. A method of forming an electrode comprising:

forming an aluminum layer and a molybdenum layer on a substrate;

forming a photoresist pattern on a predetermined portion of the molybdenum layer;

etching the molybdenum layer to expose the aluminum layer with a first mixed solution of ($H_3PO_4$+$HNO_3$+$CH_3COOH$+$H_2O$), using the photoresist pattern as an etch mask;

etching the exposed aluminum layer with a second mixed solution of ($H_3PO_4$+$HNO_3$+$CH_3COOH$+$H_2O$), using the photoresist pattern as an etch mask; and removing the photoresist pattern, wherein the first mixed solution of ($H_3PO_4$+$HNO_3$+$CH_3COOH$+$H_2O$) etches the molybdenum layer at a faster rate than it etches the aluminum layer, and wherein the second mixed solution of ($H_3PO_4$+$HNO_3$+$CH_3COOH$+$H_2O$) etches the aluminum layer at a faster rate than it etches the molybdenum layer.

11. The method of claim 10, wherein the first mixed solution of ($H_3PO_4$+$HNO_3$+$CH_3COOH$+$H_2O$) is undiluted.

12. The method of claim 10, wherein the second mixed solution of ($H_3PO_4$+$HNO_3$+$CH_3COOH$+$H_2O$) is diluted by deionized water with a mixed ratio greater 1:3.

13. The method of claim 10, wherein the first mixed solution of ($H_3PO_4$+$HNO_3$+$CH_3COOH$+$H_2O$) is diluted with deionized water with a mixed ratio less than 1:2.

14. The method of claim 13, wherein the second mixed solution of ($H_3PO_4$+$HNO_3$+$CH_3COOH$+$H_2O$) is diluted by deionized water with a mixed ratio greater than 1:3.

15. The method of claim 10, wherein the second mixed solution of ($H_3PO_4$+$HNO_3$+$CH_3COOH$+$H_2O$) is diluted by deionized water with a mixed ratio greater than 1:3.

* * * * *